(12) United States Patent
Chauhan

(10) Patent No.: US 8,193,093 B2
(45) Date of Patent: Jun. 5, 2012

(54) THRU SILICON ENABLED DIE STACKING SCHEME

(75) Inventor: Satyendra Singh Chauhan, Sugar Land, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/110,144

(22) Filed: May 18, 2011

(65) Prior Publication Data

US 2011/0250720 A1    Oct. 13, 2011

Related U.S. Application Data

(62) Division of application No. 12/369,441, filed on Feb. 11, 2009, now Pat. No. 7,973,416.

(60) Provisional application No. 61/052,458, filed on May 12, 2008.

(51) Int. Cl.
*H01L 21/44* (2006.01)
*H01L 21/48* (2006.01)

(52) U.S. Cl. ........ 438/667; 438/629; 438/675; 438/696; 438/109; 257/E21.538; 257/21.577

(58) Field of Classification Search .................. 438/667, 438/629, 675, 696, 109, 687; 257/E21.538, 257/E21.577
See application file for complete search history.

(56) References Cited

U.S. PATENT DOCUMENTS

| | | | |
|---|---|---|---|
| 5,196,371 A | 3/1993 | Kulesza et al. | |
| 5,646,067 A * | 7/1997 | Gaul | 438/458 |
| 6,114,231 A | 9/2000 | Chen et al. | |
| 6,138,348 A | 10/2000 | Kulesza et al. | |
| 6,166,969 A * | 12/2000 | Song et al. | 365/189.11 |
| 7,067,350 B1 | 6/2006 | Liou | |
| 7,335,517 B2 * | 2/2008 | Hayasaka et al. | 438/4 |
| 7,534,722 B2 * | 5/2009 | Trezza | 438/667 |
| 7,544,605 B2 * | 6/2009 | Sparks et al. | 438/622 |
| 7,602,047 B2 * | 10/2009 | Kwon et al. | 257/621 |
| 7,772,116 B2 * | 8/2010 | Akram et al. | 438/667 |
| 7,781,331 B2 * | 8/2010 | Reinert | 438/637 |
| 7,952,171 B2 * | 5/2011 | Pratt | 257/621 |
| 2002/0151169 A1 * | 10/2002 | Umetsu et al. | 438/629 |
| 2006/0001174 A1 * | 1/2006 | Matsui | 257/774 |
| 2006/0281309 A1 * | 12/2006 | Trezza | 438/675 |
| 2007/0080457 A1 * | 4/2007 | Tanida et al. | 257/739 |
| 2008/0150089 A1 * | 6/2008 | Kwon et al. | 257/621 |
| 2008/0233740 A1 * | 9/2008 | Reinert | 438/667 |
| 2009/0181494 A1 * | 7/2009 | Kim et al. | 438/107 |
| 2009/0261457 A1 * | 10/2009 | Pratt | 257/621 |

* cited by examiner

*Primary Examiner* — Nitin Parekh

(74) *Attorney, Agent, or Firm* — Steven A. Shaw; W. James Brady; Frederick J. Telecky, Jr.

(57) ABSTRACT

A die to die bonding system and method includes an upper die having a front side, a back side, and a fully filled thru silicon via, a portion of the fully filled thru silicon via protruding from the back side of the upper die. A lower die includes a front side, a back side, and a partially filled thru silicon via formed to define a via opening exposed to the front side of the die, a portion of the partially filled thru silicon via protruding from the back side of the lower die. An interconnect bonds an outer surface of the protruding portion of the upper die thru silicon via with an inner surface of via opening in the lower die.

8 Claims, 5 Drawing Sheets

THRU SILICON ENABLED DIE STACKING SCHEME

FIELD

This invention relates generally to semiconductor packaging, and more particularly conductive interconnects for die-to-die stacking.

BACKGROUND

Current known die stacking arrangements rely on formation of a metallurgical joint between die interconnect bumps and pads on abutting front surfaces of joined die. Preparation of the metallurgical joint can require complex plating finishes to be applied to the bump and/or die surface under high temperature and pressure. The die include upper and lower planar surfaces, and stacking is such that an upper planar die surface will support the lower planar surface of a subsequently stacked die.

There has been some development in the art of thru silicon vias (TSV), in which a via is etched in a die and the etched via is filled with a conductor. The conductor filled TSVs provide an electrical path by which electrical current can pass directly through the die, between two opposing sides thereof. Because TSVs allow for the shortest electrical path between two sides of the die, they have been used for three-dimensional stacking as well as for RF and MEMS wafer level packaging (WLP).

In the art of TSVs there are two basic processes that can be used for forming interconnects. These processes include via-last processing and via-first processing. In the via-last processing, interconnects are formed after a back end of line (BEOL) processing is completed. In the via-first processing, vias are formed prior to thinning the wafer and incorporating semiconductor components into the device. In the via-last approach, the substrate is thinned and some semiconductor components can be incorporated into the device prior to forming vias. Each process has its own unique characteristics. For example, in via-first processing, vias can be formed with a front side etch; while via-last processing can form vias with a back side etch. Front side etching renders characteristic markings on the substrate, whereas back side etching renders characteristic markings distinguishable from that of front side etching.

There continues to be a need for improved packaging in applications such as cellular phones, personal digital assistants (PDAs), and other small-form-factor products. At least four methods are currently used to devise a chip stack including die-to-die, package-to-package, die-to-wafer and wafer-to-wafer. These stacking methods, even with the inclusion of TSVs, continue to rely on formation of a metallurgical joint between die interconnect bumps and pads formed on the planar outer surface of the die. Accordingly, time consuming and costly steps are required to complete the metallurgical bonding between adjacent planar die surfaces.

As such, there is a need for a simple process that enables easier die stacking during semiconductor package assembly without relying solely on bumps and pads to interconnect planar surfaces of adjacent die.

BRIEF SUMMARY

An embodiment is directed to a system of die-to-die bonding.

The die-to-die bonding system includes an upper die having a front side, a back side, and a fully filled thru silicon via, a portion of the fully filled thru silicon via protruding from the back side of the upper die. The system further includes a lower die having a front side, a back side, and a partially filled thru silicon via formed to define a via opening having side walls and exposed to the front side of the lower die, a portion of the partially filled thru silicon via protruding from the back side of the lower die. An interconnect secures an outer surface of the protruding portion of the upper die fully filled thru silicon via with side wall surfaces of the via opening in the lower die.

Another embodiment is directed to a method of die-to-die bonding.

The method includes forming an upper die comprising a front side, a back side, and a fully filled thru silicon via, a portion of the fully filled thru silicon via protruding from the back side of the upper die; forming a lower die comprising a front side, a back side, and a partially filled thru silicon via formed to define a via opening having side walls and exposed to the front side of the die, a portion of the partially filled thru silicon via protruding from the back side of the lower die; and interconnecting an outer surface of the protruding portion of the upper die fully filled thru silicon via with side wall surfaces of the via opening in the lower die.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The invention is best understood from the following detailed description when read with the accompanying figures. It is emphasized that in accordance with the standard practice in the semiconductor industry, various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

According to embodiments, an exemplary die stacking system and method eliminates complex metal finish plating in interconnect bumps/pads formed on planar die surfaces and provides a robust and reliable interconnection between adjacent stacked die using partially and fully filled thru silicon vias.

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Figure 1A:
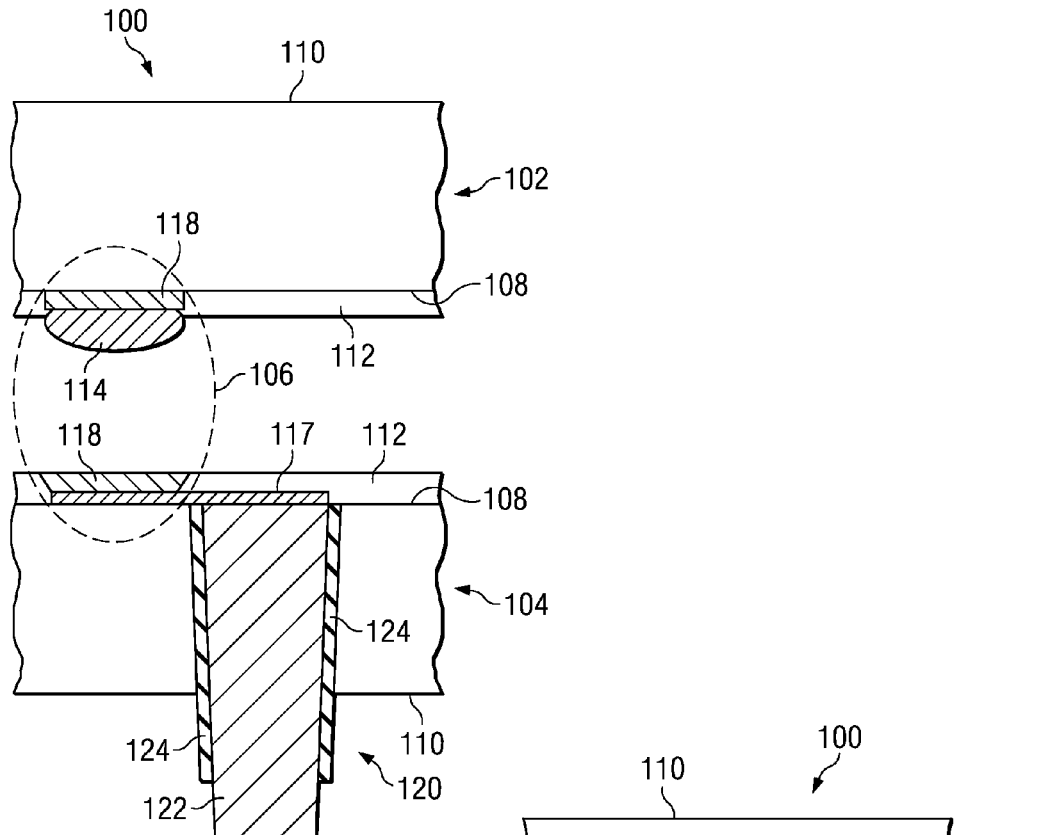
FIG. 1A is an exploded diagram of a known die-to-die bonding scheme.
Figure 1B:
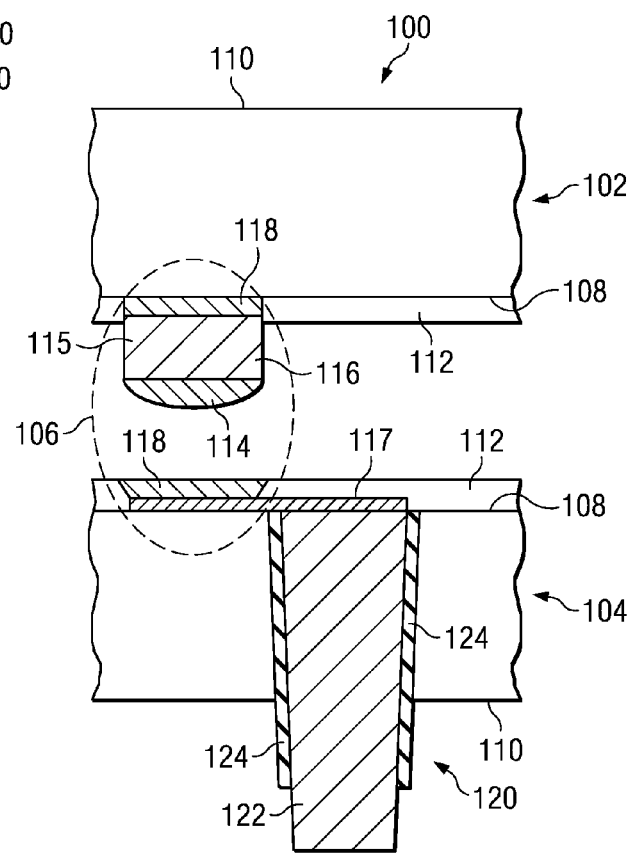
FIG. 1B is an exploded diagram of an additional known die-to-die bonding scheme.
Figure 1C:
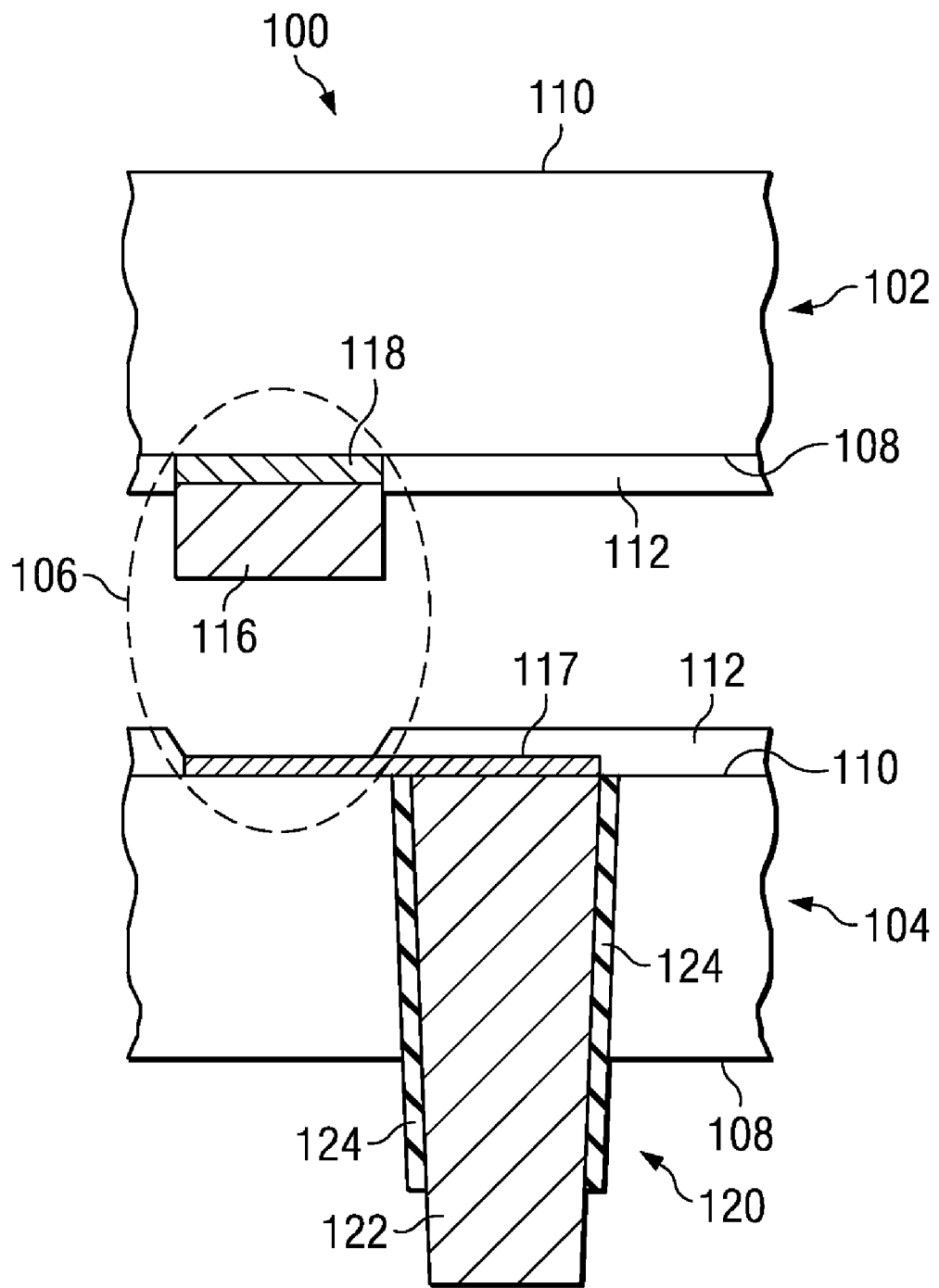
FIG. 1C is an exploded diagram of a yet another known die-to-die bonding scheme.

FIGS. 1A through 1C are exploded diagrams of known die-to-die bonding schemes 100.

In each of the known schemes illustrated in FIGS. 1A through 1C, a substantially planar surface of an upper die 102 is bonded to a substantially planar surface of a lower die 104 with a bump bond 106 type of connection as generally depicted by dashed oval lines in each of FIGS. 1A through 1C. Each of the upper die 102 and lower die 104 includes a front side 108 and a back side 110, the front side typically including a protective coating 112 thereon. The front side 108 of the upper die 102 includes the bump bond thereon which is bonded to various surfaces on the front side 108 of the lower die 104. The front side 108 of the lower die 104 is depicted as including a copper layer 117 thereon, and can include additional materials formed over the copper layer. Thus, die-to-die bonding is front side to front side, more specifically planar front side to planar front side, and further relies on complex plating finishes applied to the die surfaces in order to create the bonding components.

By way of further example, the bump bond type connection 106 of FIG. 1A includes a nickel alloy 118 on the upper surface of the upper die 102, and a lead-free solder bump 114 over the nickel alloy 118 in the protective coating 112. The front side 108 of lower die 104 includes the copper layer 117 and a nickel alloy 118 in a bonding region formed over the copper layer in the protective coating 112. As known in the art, the nickel alloy 118 in the bonding region can include an alloy of, for example, $Ni_{(n)}Au_{(n)}$, $Ni_{(n)}Pd_{(n)}$, or $Ni_{(n)}Pd_{(n)}Au_{(n)}$. The lower die 104 also includes a fully formed thru silicon via 120. The fully formed thru silicon via 120 includes a conductor material 122 such as copper therein and an insulator 124 between the die 104 and conductor material 122. In bonding, the lead free solder bump 114 of the upper die 102 bonds under heat and pressure with the nickel alloy 118 of the lower die 104 in a front side 108 to front side 108 configurations as known in the art.

In a further known die-to-die bonding scheme as depicted in FIG. 1B, an alternative bump bond type connection 106 on the front side 108 of the upper die 102 includes the nickel alloy 118, a copper bump 116 formed on the nickel alloy 118, and a lead free solder bump 114 formed over the copper bump 116. All remaining features are common to FIG. 1A. In bonding, the lead free solder bump 114 of the upper die 102 bonds under heat and pressure with the nickel alloy 118 of the lower die 104 in a front side 108 to front side 108 configuration as known in the art.

In yet another known die-to-die bonding scheme as depicted in FIG. 1C, the bump bond type connection 106 on the front side 108 of the upper die 102 includes nickel alloy 118 and copper bump 116 formed on the alloy 118 in the protective coating 112. The protective coating 112 of the lower die 104 is etched or otherwise removed to reveal the bare copper layer 117. All remaining features are common to FIG. 1A. In bonding, the copper bump 116 of the upper die 102 bonds under heat and pressure to the bare copper 117 of the lower die 104 in a front side 108 to front side 108 configuration as known in the art.

Each of the known bonding techniques suffer from the inherently fragile nature of bonding adjoining planar surfaces, in addition to the complex metal finishing and plating required to form the bump bonds on the planar surfaces of the dies. Accordingly, the following exemplifies a simple system and method that enables secure bonding in a die-to-die stacking during semiconductor package assembly and using thru silicon via (TSV) technology.

There are generally three types of via filling, including lining along the sidewall of vias, full filling within vias, and full filling with stud formation above the via. The stud can function as a mini-bump for solder bonding. Two methodologies have been generally adopted to achieve the three types of via filling. The first methodology is characterized in the art as a via-first approach which includes via filling (including a seed layer), followed by wafer thinning. The second methodology is characterized in the art as a via-last approach in which wafer thinning occurs first followed by via filling. The first methodology is that used in the exemplary embodiments herein. While deposition conditions are known to affect filling of the vias, of the known via filling methodologies and parameters, it is intended that via filling, for both partial and full filling of the via, is conformal to side walls of the via, and in the case of fully filling the via, optimized conditions are expected which can repeatedly achieve void-free, bottom-up filling of various via sizes. For example, via dimensions can be from about 5 μm to about 40 μm in diameter and from about 25 μm to about 150 μm in depth.

Figure 2A:
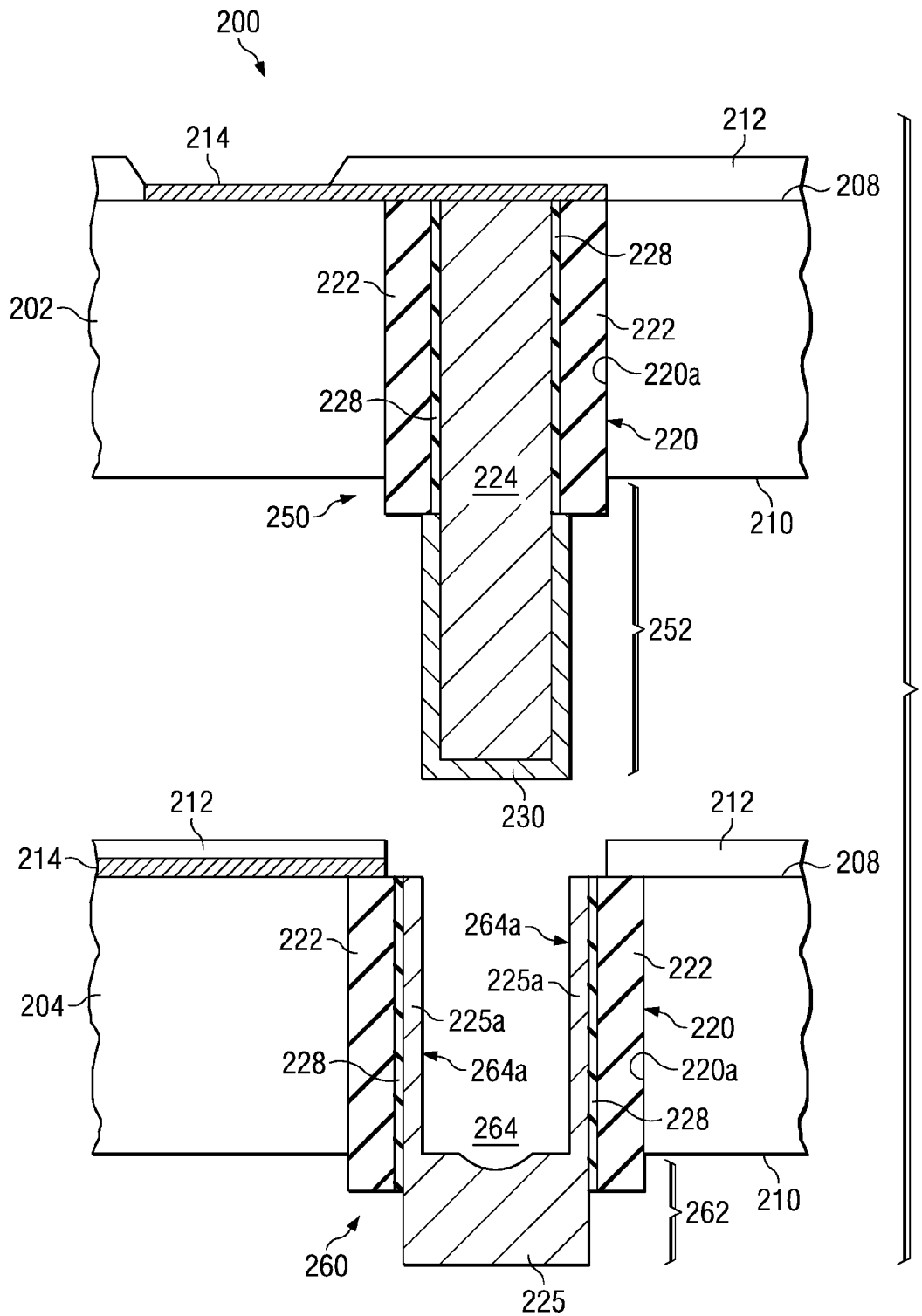
FIG. 2A is an exploded diagram illustrating an exemplary die-to-die bonding system according to certain embodiments.
Figure 2B:
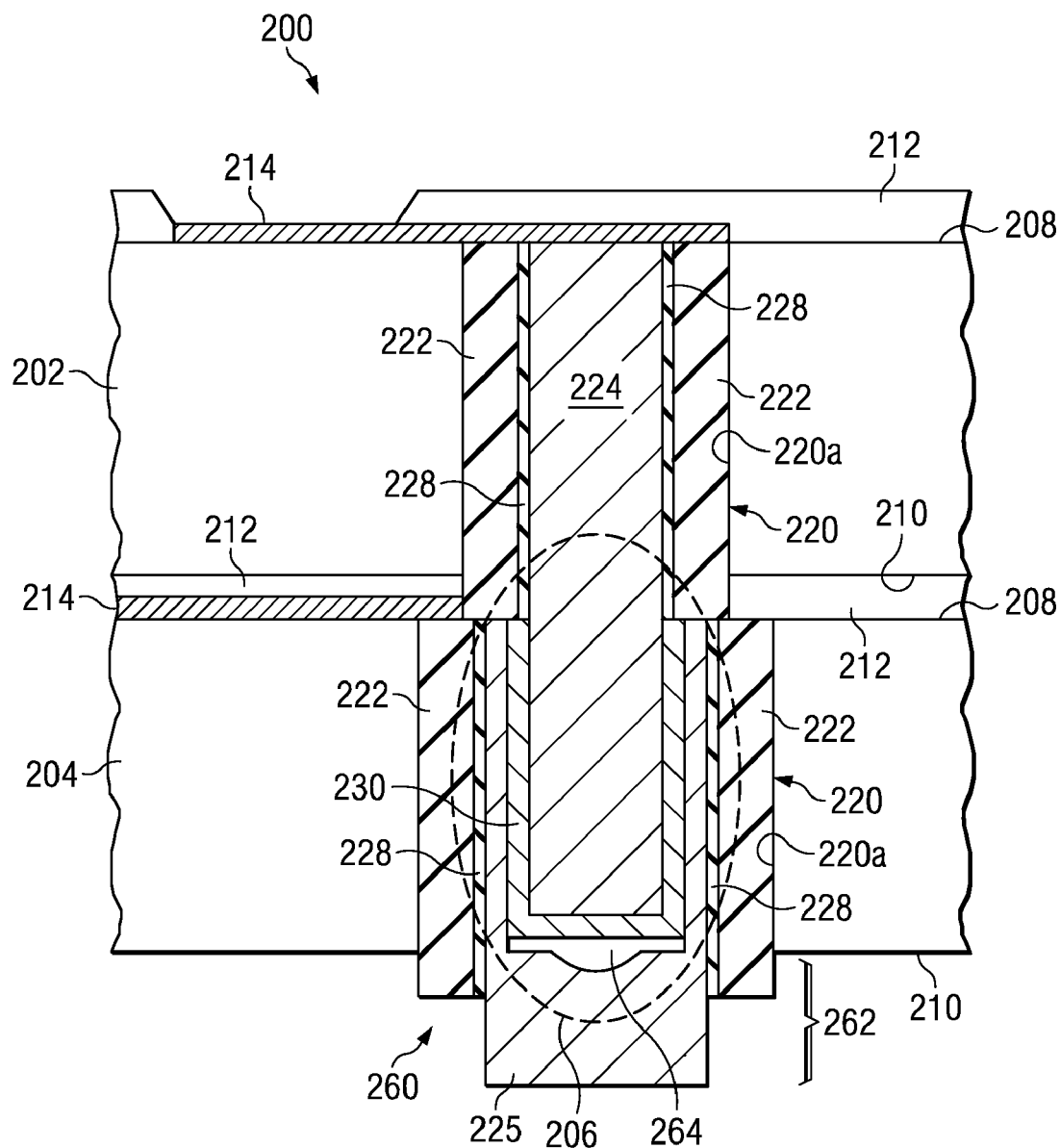
FIG. 2B is a diagram illustrating exemplary stacked dies according to certain embodiments.

FIG. 2A is an exploded diagram illustrating an exemplary die-to-die bonding system 200 according to certain embodiments and FIG. 2B is a diagram illustrating stacked dies using the bonding system 200 according to certain embodiments. It should be readily apparent to those of ordinary skill in the art that the die-to-die bonding system 200 illustrated in FIGS. 2A and 2B represents a generalized illustration and that other components can be added or existing components may be removed or modified.

In the following, and as previously mentioned, the figures are not completely to scale and instead are exaggerated in order to clearly depict certain features of the drawings. For example, in a side view, the thru silicon via can be about 25 μm wide and have a depth from about 100 μm to about 130 μm within a substrate.

Referring to both FIG. 2A and FIG. 2B, the system 200 includes an upper die 202, a lower die 204, and an interconnect 206 bonding the upper and lower dies together. It will be appreciated that the terms "upper" and "lower" are for purposes of describing the relative relationship of the stacked and bonded dies, and are not intended to be limiting of a relative relationship thereof.

Each of the upper die 202 and lower die 204 can include a front side 208, and a back side 210 opposing the front side. Front side 208 and back side 210 are terms intended to define an orientation of the die when stacked as will be further described. The upper die 202 and lower die 204 can be formed of, for example, silicon and by any suitable process known in the art. A metal layer 214 of, for example copper, can be formed on the front side 208 of each of the upper 202 and lower 204 die. A protective overcoat 212 can be formed on the front side 208 of each or the upper die 202 and lower die 204, over the copper layer 214, and by any suitable process as known in the art. The protective overcoat 212 can be formed of, for example, silicon oxide or silicon nitride.

A via, such as a thru silicon via 220 can be formed in each of the upper die 202 and lower die 204, either prior or subsequent to deposition of the protective overcoat 212. The thru silicon via 220 can be formed by, for example, etching or laser, resulting in a substantially vertical via through the silicon of the respective die. Thru silicon via 220 can include substantially vertical side walls 220a defining an inner shape of via 220. As an alternative, it will be appreciated that the thru silicon via 220 can include tapered sidewalls (not shown). Tapered via sidewalls can be formed by a suitable process as known in the art for forming tapered vias and can be at its widest at the front side and narrower at the back side of each of the upper and lower die 204, respectively. It will be appreciated that profile control of an etching process can be used to obtain a thru silicon via of a desired shape and depth in the substrate.

An insulator 222 can be formed on an inner surface of side walls 220a of thru silicon via 220 to a thickness suitable for providing insulative properties. The insulator 222 can further protect the upper die 202 and lower die 204 from a conductive material subsequently deposited in the thru silicon via 220. Formation of the insulator 222 can be by any known process in the art, such as deposition. The insulator 222 can formed of any electrically insulating material, for example a dielectric such as an oxide.

A barrier layer 228 can be formed between the insulator and a subsequently deposited conductive material 224 in each of the upper 202 and lower 204 thru silicon vias. The barrier layer 228 can be, for example, a metal such as sputtered tantalum nitride for diffusion barrier and adhesion promoter properties with insulator material 222 and conductive material 224. An exemplary thickness of the barrier layer 228 can be from about 500 Å to about 1000 Å over the insulator material 222.

In each of the upper die 202 and lower die 204, conductive material 224 and 225, respectively, can be deposited in the thru silicon via 220 and on an exposed surface of the barrier layer 228. Alternatively, absent the barrier layer 228, conductive material 224, 225 can be deposited in the thru silicon via 220 on an exposed surface of the insulator 222. In the upper die 202, deposition of conductive material 224 can be of an amount to form a fully filled thru silicon via 250. In the lower die 204, deposition of conductive material 225 can be of an amount and by a process to form a partially filled thru silicon via 260. Deposition processes for depositing the conductive material 224, 225 are known in the art (for example, electroplating, sputtering, chemical vapor deposition, physical vapor deposition) and description will be omitted herein for the sake of brevity.

In the upper die 202, the fully filled thru silicon via 250 can include a tip portion 252 of conductive material 224 protruding from the back side 210 of the upper die 202 by a predetermined distance. Typically, the conductive material 224 filling each via 220 of the upper die 202 can be copper and can be preceded by deposition of a seed layer (not shown) as known in the art. The tip portion 252 of the fully filled thru silicon via 250 can be exposed by etching from the back side 210 of the upper die 202. Etching can be by any known process selective to the insulator material 222 and to the conductive material 224 of the fully filled thru silicon via 250.

Referring still to the upper die 202, a solder material 230 can be deposited on the exposed tip portion 252 of the fully filled thru silicon via 250, and thus coating the conductive material 224 comprising the tip portion 252. The solder material 230 can be deposited on part or all of the tip portion 252 and of a sufficient thickness and placement to enable secure bonding in a complementary partially filled thru silicon via 260 as will be further described. The solder material 230 depicted in FIG. 2A is characteristic of a solder deposition, and typically might not be a uniform deposition; however, a uniform deposition of the solder material is not outside the scope of the exemplary embodiments. An exemplary solder material 230 can include tin or other suitable material exhibiting reflow at a temperature range of about 200-260° C. Further, the exemplary solder material can exhibit reflow at a temperature of about 213° C.

In the lower die 204, deposition of conductive material 225 can be terminated to only partially fill via 220 from the bottom up, and can further only plate the side walls of the via without fully filling via 220, resulting in thin sidewall layers 225a of the conductive material 225. The partial fill can be achieved by selecting, for example, speed, time, and thickness of a plating process as is known in the art. It will be appreciated that additives in plating chemistry and circulation of plating chemicals (fluids) can control the direction of plated metal growth. Here, a selected plating process provides a uniform deposition thickness on an inner surface of the via. The thin layer of conductive material 225 can be deposited to result in a partial filling and thin plating of the via is such that an opening 264 remains in the partially filled thru silicon via 260. Via opening 264 is defined by side walls 264a conforming to the general shape and contour of thru silicon via side walls 220a. Via opening 264 is open to the front side 208 of the lower die 204.

The partial filling and plating of thru silicon via 220 in the lower die 204 can be by deposition, electroplating or other known process to achieve the intended result as known in the art. For example, a bottom-up electroplating conducted at a fast rate can plate the sidewalls and partially fill the bottom of the via. Additionally, the partial filling can be preceded by a seed layer (not shown) of the conductive material. The material can be, for example, copper. A thickness of side wall layers 225a of the partially filled thru silicon via 260 can be from about 3 µm to about 10 µm, and further from about 5 µm to about 7 µm, according to a deposition process.

A tip portion 262 of the partially filled thru silicon via 260 can be exposed by etching the back side 210 of the lower die 204 to a depth sufficient to expose a predetermined height of the conductive material 225. A height of the tip portion 262 can be from about 15 µm to about 30 µm from the back side 210 of the substrate die 204. Etching can be by a process selective to the insulator material 222, the underlying barrier layer 228, and further selective to the conductive material 225 of the partially filled thru silicon via 260. A resulting thickness of the wafer can be about 100 µm thick.

While the insulator 222 is depicted as extending beyond the back side 210 of each of the upper die 202 and lower die 204, the insulator being exposed as a result of selective etching to the back side of each of the die, it will be appreciated that the presence of the insulator 222 as well as the height of the tip portions 252 and 262 of conductive material 224, 225 beyond the back side 210 of the upper die 202 and lower die 204, respectively, can vary according to various etching processes on the die.

As depicted in FIG. 2B, the upper die 202 can be mated with the lower die 204 to form a secure interconnect 206. Specifically the tip portion 252 of the fully filled thru silicon via 250 is inserted into the opening 264 of the partially filled thru silicon via 260. An insertion depth of the protruding portion 252 within the opening 264 can be such that portions of insulator 222 of the upper die 202 seats (against an upper surface of the lower die). However, it will be appreciated that notching and various indentations on the front surface 208 of the lower die 204 can vary according to etching processes, and such surface variations do not inhibit seating of the tip portion 252 of the upper die 202 into the opening 264 of the lower die 204. The solder material 230 on the protruding tip portion 252 of the fully filled thru silicon via 250 can be of a thickness to be in surface contact with the side walls 264a of the partially filled thru silicon via 260 of the lower die 204. Upon reflow of the solder material 230, a metallurgical interconnect joint can be formed between the upper die 202 and lower die 204 at a juncture of the tip portion 252 of the fully filled thru silicon via 250 and the side walls 264a of the partially filled/plated thru silicon via 260 as depicted at the interconnect 206.

Although the tip portion 252 of the conductive material 224 for the fully filled thru silicon via 250 is illustrated as being spaced from a bottom of the partially filled thru silicon via opening 264, such a spacing can vary according to process parameters, and can even be absent. It will be further appreciated that the upper die 202 and lower die 204 can initially be press fit together with the protruding tip portion 252 of the fully filled thru silicon via 250 fitting into via opening 264 of the partially filled thru silicon via of the lower die 204. The press fit can then be permanently bonded with the solder at a reflow temperature range of about 200-260° C. to create the metallurgical joint as described. For example, the reflow temperature can be about 213° C.

Alternatively, in the instance of a larger tolerance between the fully filled thru silicon via and the opening 264 of the partially filled thru silicon via, an initial press fit of the tip portion 252 with side walls 264a of opening 264 may not necessarily occur. Instead, a thickness of the solder material 230 can be applied to the tip portion 252 according to a tolerance between side walls 264a of the opening 264 and an outer circumference or dimension of the tip portion 252. A bond by the metallurgical interconnect joint can then be formed between the solder 230 and side walls 264a by heating the solder to the described reflow temperature.

It will also be appreciated that upper die 202 and lower die 204 can be formed from any suitable semiconductor material, such as silicon. For example, each die can include a substrate, which can be a silicon wafer with an oxide layer, such as $SiO_2$, buried in the substrate. The substrate can include any number and type of semiconductor elements or devices. For example, the substrate can include an N-type well region. The buried oxide layer and substrate can be formed utilizing any well-known technique available in semiconductor processing. Likewise, each die can include a gate, which in turn can include a gate stack and sidewalls. The gate stack can be formed using any suitable growth and/or deposition techniques using semiconductor processing and can be formed from any suitable material or combination of material. The gate stack can comprise a metal gate stack, such as a gate oxide, metal layer, and capping layer. For example, the metal gate stack can comprise an in situ steam generated (ISSG) gate oxide, TiN metal layer, and AmSi capping layer.

Additionally, according to embodiments, the device can be formed by two types of thru-silicon via technologies: dry etch and laser. Either technology can be used to form the thru silicon vias of the exemplary disclosure without departing from the scope of the disclosure. With laser technology, a tiny laser can be used to drill the holes in the die. This can reduce production cost by eliminating typical photolithography-related processes required for mask-layer patterning. It can also shorten the process needed to penetrate a die.

Figure 3:
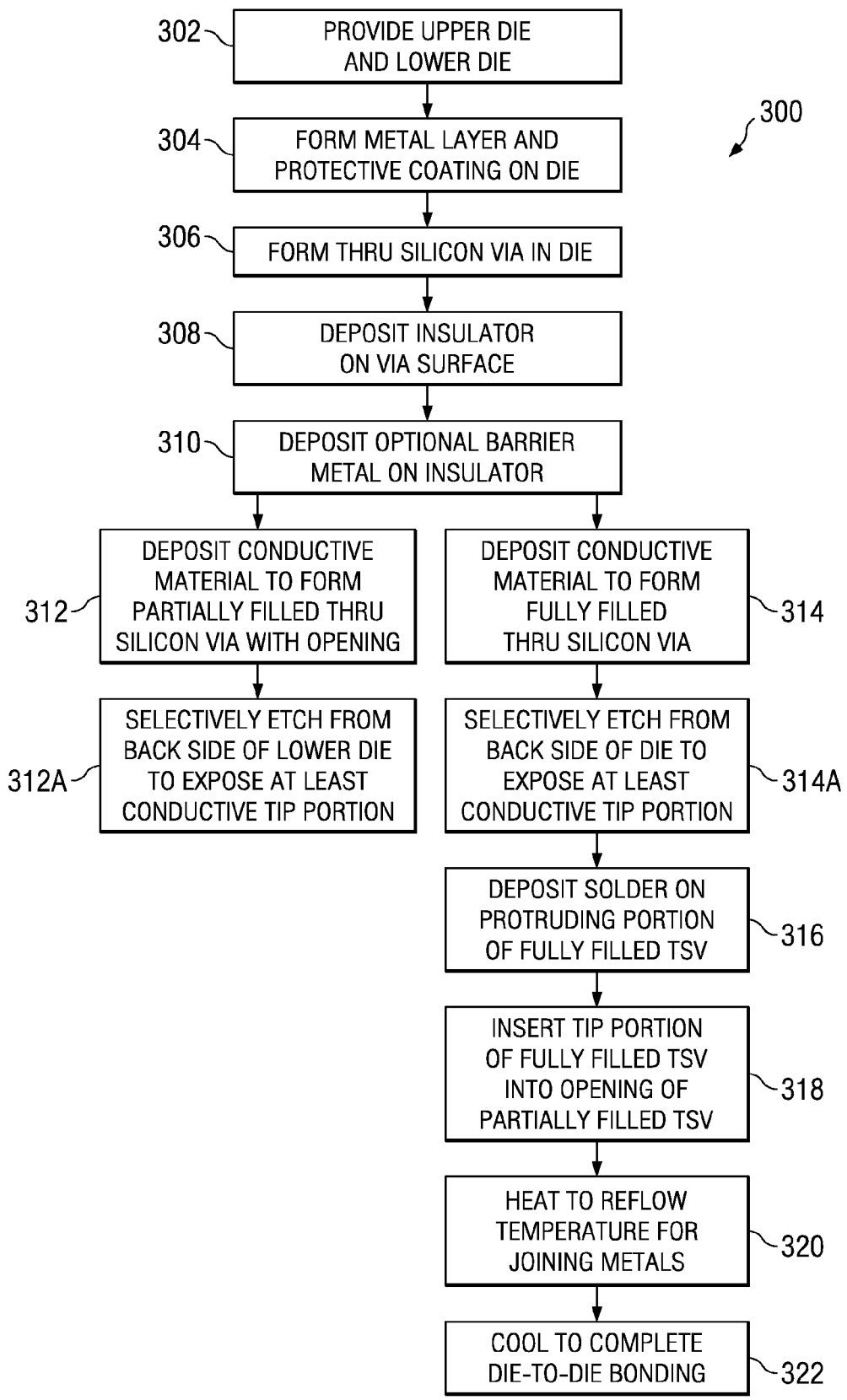
FIG. 3 is a general schematic diagram of an exemplary process of die-to-die bonding according to certain embodiments.

FIG. 3 is a flow diagram illustrating a method 300 of fabricating stacked die consistent with embodiments of the present disclosure. It should be readily apparent to those skilled in the art that FIG. 3 is exemplary and that other steps can be added or existing steps can be removed without departing from the scope of the exemplary embodiments.

Method 300 begins with providing a lower die and an upper die, in step 302. Each of the lower die and upper die are provided with a metal layer and protective coating in step 304 and a thru silicon via is formed in step 306. The thru silicon via can be oriented substantially vertically within the die, and include either substantially vertical side walls or tapered side walls. Further, an insulator can be deposited on the side walls at step 308 to a predetermined insulative thickness. A barrier metal can then be deposited on the insulator at step 310.

In the lower die, a conductive material can be deposited in the thru silicon via at 312 to a predetermined thickness on side walls to form a partially filled thru silicon via having an opening exposed to the front side of the die.

In the upper die, a conductive material can be deposited in the thru silicon via at 314 to a thickness which forms a fully filled thru silicon via.

In step 312A and 314A, a back side of each of the lower and upper die, respectively, can be selectively etched to expose at least a tip portion of the conductive material. The etching can also be selective to the insulator material such that an insulator jacket remains around a portion of the conductive tip adjacent the back surface of each of the die.

A solder material can be applied to the exposed tip portion of the fully filled thru silicon via at the back side of the upper die in step 316.

In step 318, the exposed tip portion of the fully filled thru silicon via of the upper die can be inserted into via opening of the partially filled thru silicon via in the lower die. Insertion can be by press fit in the presence of a tapered partially filled thru silicon via and a corresponding tapered conductive tip of a fully filled thru silicon via or when there is a tight tolerance between the partially filled thru silicon via and the conductive tip of the fully filled thru silicon via. At step 320, heat is applied to the interconnection at a temperature sufficient to reflow the solder material and metallurgically bond the fully filled thru silicon via of the upper die to the partially filled thru silicon via of the lower die. At step 322, the interconnect is cooled to complete the die-to-die bonding process.

While a certain order of steps is presented above, it will be appreciated that, for example, forming of the fully filly thru silicon via and forming the partially filled thru silicon via can occur sequentially with either the upper die or the lower die processed first or second, simultaneously, and in batches.

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of die to die bonding, comprising:
forming an upper silicon die comprising a front side, a back side, and a fully filled thru silicon via with an exposed a tip portion of the fully filled thru silicon via projecting from the back side of the upper silicon die;
forming a lower silicon die comprising a front side, a back side, and a partially filled thru silicon via with an opening exposed at the front side, the opening having an inner surface;
inserting the exposed tip portion of the fully filled thru silicon via of the upper silicon die into the opening of the partially filled thru silicon via of the lower silicon die; and
connecting the exposed tip portion of the fully filled thru silicon via of the upper silicon die to the inner surface of opening in the lower silicon die.

2. The method of claim 1, wherein the connecting step comprises applying solder on the exposed tip portion of the fully filled thru silicon via, and bonding the solder to the inner surface of the thru silicon via of the lower silicon die.

3. The method of claim 2, wherein bonding the solder to the inner surface of the opening in the lower silicon die comprises heating to cause the solder to reflow.

4. The method of claim 1, wherein the thru silicon via of the upper silicon die comprises a conductive core and an insulator insulating the conductive core from silicon around the core.

5. The method of claim 4, wherein the conductive core comprises copper.

6. The method of claim 1, wherein forming the lower die comprises forming a conductive core and an insulator insulating the conductive core from silicon around the core.

7. The method of claim 6, wherein forming the conductive core comprises electroplating copper.

8. The method of claim 7, wherein the electroplating copper only partially fills the thru silicon via of the lower silicon die.

* * * * *